United States Patent
Nistler

(10) Patent No.: US 10,551,466 B2
(45) Date of Patent: Feb. 4, 2020

(54) CORRECTION OF A MAGNETIC RESONANCE TRANSMISSION SIGNAL

(71) Applicant: Jürgen Nistler, Erlangen (DE)

(72) Inventor: Jürgen Nistler, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 15/861,888

(22) Filed: Jan. 4, 2018

(65) Prior Publication Data
US 2018/0196114 A1 Jul. 12, 2018

(30) Foreign Application Priority Data
Jan. 12, 2017 (DE) .................. 10 2017 200 446

(51) Int. Cl.
*G01R 33/565* (2006.01)
*G01R 33/56* (2006.01)

(52) U.S. Cl.
CPC ..... *G01R 33/5659* (2013.01); *G01R 33/5608* (2013.01)

(58) Field of Classification Search
CPC .............. G01R 33/5659; G01R 33/583; G01R 33/5608; G01R 33/445; G01R 33/4835
USPC ....................................................... 324/309
See application file for complete search history.

(56) References Cited

U.S. PATENT DOCUMENTS

| 5,461,314 | A * | 10/1995 | Arakawa | G01R 33/3628 |
| | | | | 324/318 |
| 8,901,929 | B2 | 12/2014 | Biber et al. | |
| 2008/0136721 | A1 * | 6/2008 | Parsche | H01Q 7/00 |
| | | | | 343/742 |
| 2008/0258728 | A1 | 10/2008 | Vernickel et al. | |
| 2009/0045859 | A1 * | 2/2009 | Huffman | A61B 6/032 |
| | | | | 327/159 |
| 2009/0146658 | A1 * | 6/2009 | McDowell | G01N 24/088 |
| | | | | 324/309 |

(Continued)

FOREIGN PATENT DOCUMENTS

| DE | 102012210280 B4 | 12/2013 |
| DE | 102013226170 A1 | 6/2015 |

OTHER PUBLICATIONS

Kuznetsov, Yury, et al. "The ultra wideband transfer function representation of complex three-dimensional electromagnetic structures." 34th European Microwave Conference, 2004.. vol. 1. IEEE, 2004. (Year: 2004).*

(Continued)

*Primary Examiner* — Christopher P McAndrew
(74) *Attorney, Agent, or Firm* — Lempia Summerfield Katz LLC

(57) ABSTRACT

The disclosure relates to a method for determining a transfer function of a transmitting system of a magnetic resonance device, to a method for the correction of a transmission signal of a magnetic resonance device, to a corresponding magnetic resonance device, and to a computer program product for carrying out the method. The method includes determining a transfer function using a transmission characteristic of a transmitting system of the magnetic resonance device, wherein the transfer function is frequency-dependent. A transmission signal may be corrected using the transfer function. An excitation pulse may be emitted by the transmitting system using the corrected transmission signal.

20 Claims, 3 Drawing Sheets

(56) References Cited

U.S. PATENT DOCUMENTS

| | | | |
|---|---|---|---|
| 2013/0207654 A1* | 8/2013 | Takizawa | G01R 33/56572 |
| | | | 324/312 |
| 2013/0338488 A1 | 12/2013 | Dietz et al. | |
| 2014/0111204 A1* | 4/2014 | Wu | A61B 5/055 |
| | | | 324/309 |
| 2014/0218028 A1* | 8/2014 | Snyder | G01R 33/4816 |
| | | | 324/309 |
| 2014/0347054 A1 | 11/2014 | Kimmlingen et al. | |
| 2014/0357979 A1* | 12/2014 | Basser | G01R 33/5608 |
| | | | 600/410 |
| 2015/0168516 A1 | 6/2015 | Eberler et al. | |
| 2016/0069970 A1* | 3/2016 | Rearick | G01R 33/3854 |
| | | | 324/309 |

OTHER PUBLICATIONS

Gaikovich, K. P., et al. "Rectification of near-field images." Proceedings of 2002 4th International Conference on Transparent Optical Networks (IEEE Cat. No. 02EX551). vol. 1. IEEE, 2002. (Year: 2002).*

Lebsack, Eliot T., and Steven M. Wright. "Iterative RF pulse refinement for magnetic resonance imaging." IEEE transactions on biomedical engineering 49.1 (2002): 41-48. (Year: 2002).*

German Office Action for related German Application No. 10 2017 200 446.0 dated Sep. 22, 2017.

* cited by examiner

CORRECTION OF A MAGNETIC RESONANCE TRANSMISSION SIGNAL

The application claims the benefit of German Patent Application No. DE 10 2017 200 446.0, filed Jan. 12, 2017, which is hereby incorporated by reference in its entirety.

TECHNICAL FIELD

The disclosure relates to a method for determining a transfer function of a transmitting system of a magnetic resonance device, to a method for the correction of a transmission signal of a magnetic resonance device, to a corresponding magnetic resonance device, and to a computer program product for carrying out the method.

BACKGROUND

Magnetic Resonance Imaging (MRI) is a known examination technique for generating images of the inside of a body of a patient, and is based on the physical phenomenon of magnetic resonance (MR). A magnetic resonance device includes, for this purpose, a transmitting system, with which radio frequency (RF) electromagnetic excitation pulses, (also called RF pulses), may be generated which are irradiated into the patient during a magnetic resonance scan. U.S. Patent Application Publication No. 2014/0347054 A1, U.S. Pat. No. 8,901,929 B2, and German Patent No. DE 10 2012 210 280 B4 disclose, by way of example, various embodiments of a transmitting system. From the RF irradiation, a magnetic alternating field results having a transmit frequency, which is also called the $B_1$ field. The irradiated excitation pulses are capable of deflecting nuclear spins in order to obtain a desired flip angle distribution for the respective examination. The deflected nuclear spins in turn emit MR signals, which are measured by the magnetic resonance device.

The transmitting system includes at least one RF antenna, which may also be called a RF transmitting antenna. The RF transmitting antenna is operated, for example, by at least one RF amplifier. The at least one RF amplifier transmits a transmission signal by a RF transmitting voltage to the RF transmitting antenna. The transmission signal has, for example, a sinusoidal shape having a particular transmit frequency, which is limited by an envelope, (e.g., a rectangular or Gaussian curve).

Scaling of the RF transmitting voltage for the RF pulses may be based on a reference voltage obtained in advance by a scan on the respective patient. During this scan, RF pulses are generated by transmission signals whose transmit frequency is the center frequency of the transmitting system. During recording of imaging scan data that follows the scaling, the problem occurs of the image quality may be inadequate in the case of excitation by RF pulses that are played at a different transmit frequency to the center frequency.

SUMMARY AND DESCRIPTION

The object of the present disclosure includes a method that improves the image quality in the case of excitation by RF pulses that are not played at the center frequency.

The scope of the present disclosure is defined solely by the appended claims and is not affected to any degree by the statements within this description. The present embodiments may obviate one or more of the drawbacks or limitations in the related art.

A method for determining a transfer function of a transmitting system of a magnetic resonance device is proposed. A transfer function is determined using a transmission characteristic of a transmitting system of the magnetic resonance device, wherein the transfer function is frequency-dependent. A transmission signal may be corrected using the transfer function. An excitation pulse may be emitted by the transmitting system using the corrected transmission signal.

In particular, a frequency-dependent deviation in the $B_1$ field may be corrected by the transfer function. In particular, it may be achieved thereby that even in the case of RF pulses which are not played at center frequency, the reference to a possible reference voltage is correct, so the desired flip angle is excited in this case as well. The image quality, (e.g., the image homogeneity), may therefore be significantly improved. The determined transfer function may be saved in a storage unit.

The transmitting system may include at least one RF transmitting antenna, in particular, a body coil. Body coils, (e.g., whole-body coils), may be permanently integrated in the magnetic resonance device.

The transmission characteristic of the transmitting system may be defined by structural properties, (e.g., the size and/or the form and/or the construction), of the transmitting system. In other words, the hardware configuration of the transmitting system as a rule determines the transmission characteristic of the transmitting system. The properties of the at least one RF transmitting antenna may dominate the transmission characteristic of the transmitting system, but other components in the transmission chain may also have an effect thereon. The transmission characteristic of the transmitting system, in particular, of the at least one RF transmitting antenna, may be described by the bandwidth and/or the frequency response of the transmitting system. The bandwidth of the at least one RF transmitting antenna depends, in particular, on its quality (also called the quality factor or Q-factor). As a rule, the quality may be determined from the ratio of the resonance frequency of the transmitting system to the bandwidth of the transmitting system.

The transfer function $H(f)$ may reflect a transmission of a RF transmitting voltage $U_{tra}(f)$, which is applied to the at least one RF transmitting antenna, in the generated $B_1$ field $B_1(f)$: $H(f) \propto B_1(f)/U_{tra}(f)$. The frequency f may also be described as the angular frequency $\omega = 2\pi f$. During determination of the transfer function, it is not usually a matter of determining an absolute value for $H(f)$. Instead, what is crucial is the relative change in $H(f)$ as a function of the frequency f. Of particular interest is by what factor the generated $B_1$ field $B_1(f)$ changes with a change in f. This makes it possible to calculate factors, for example, for two values $f_1$ and $f_2$, as $B_1(f_1)/B_1(f_2)$.

A plurality of methods is conceivable for determining the transfer function $H(f)$. In particular, the transfer function is determined using an absorbed power.

For example, the frequency dependency of the generated $B_1$ field is determined, in particular empirically, by way of an input reflection factor of the at least one RF transmitting antenna. If the input reflection factor $R(f)$ is known, $H(f)$ may then be approximated by $H(f) \propto (1-|R(f)|^2)^{1/2}$. Here, $1-|R(f)|^2$ describes the absorbed power. The absorbed power, and therewith the transfer function $H(f)$, may therefore be determined using the input reflection factor $R(f)$.

The input reflection factor $R(f)$ may be calculated from a ratio of a returning, in particular reflected, voltage to a forward voltage. The two voltages may be measured, for example, with the aid of directional couplers.

A further embodiment of the method provides that the transfer function is determined using a current in a RF transmitting antenna. This embodiment is based on the knowledge that the generated $B_1$ field is proportional to the current $I(f)$ in the RF transmitting antenna, in other words $B_1(f) \propto I(f)$. By measuring the current, more precisely: the current strength, the transfer function $H(f) \propto I(f)/U_{tra}(f)$ may therefore also be determined.

The transfer function, in particular, the current in the RF transmitting antenna, may be determined using at least one pickup probe. The at least one pickup probe may be arranged in the vicinity of the RF transmitting antenna, for example, with an embodiment of the RF transmitting antenna as a birdcage coil, on an end ring of the birdcage coil.

The voltage $U_{pu}(f)$ induced in the at least one pickup probe is proportional to the current $I(f)$ in the RF transmitting antenna, for example, in the end ring of a birdcage coil, and therewith also proportional to the generated $B_1$ field $B_1(f)$, in other words $U_{pu}(f) \propto B_1(f)$. The transfer function $H(f) \propto U_{pu}(f)/U_{tra}(f)$ may then in turn be determined thereby.

A further embodiment provides that the transfer function, in particular, the current in the RF transmitting antenna, is determined using a forward and/or reflected voltage in a power supply unit to the RF transmitting antenna. The power supply unit may include at least one electrical line which connects the RF transmitting antenna to the at least one RF amplifier. In particular, a value $U_{pu,coupling}(f)$ may be obtained from a measurement of a complex addition of the forward and reflected voltage and this is in turn proportional to the current $I(f)$ in the RF transmitting antenna and therewith also to the generated $B_1$ field $B_1(f)$, in other words $U_{pu,coupling}(f) \propto B_1(f)$. The transfer function is then produced in particular from the following relationship: $H(f) \propto U_{pu,coupling}(f)/U_{tra}(f)$.

According to a further embodiment, the transfer function is determined by a variation in an applied magnetic field. The applied magnetic field may be a magnetic field for predicting the nuclear spins deflected by the excitation pulses. As a rule, the applied magnetic field $B_0$ is proportional to the Larmor frequency $f_L$, in other words the frequency with which the nuclear spins precess, or in other words $f_L = \gamma B_0$, where $\gamma$ is the gyromagnetic ratio. The frequency $f_L$ may also be varied by way of the applied magnetic field $B_0$ therefore. The frequency-dependent transfer function $H(f)$ may therefore be determined by the variation in the applied magnetic field.

The applied magnetic field $B_0$ may be generated by a main magnet that includes, for example, at least one, in particular superconducting, main magnet coil, and may be varied by the main magnet itself and/or by at least one further magnet. The magnetic field $B_{0,m}$ generated by the main magnet itself may be varied, for example, by a change in the current flow through the at least one main magnet coil.

The applied magnetic field $B_0$ A is varied by the at least one further magnet, for example, by generation of a further magnetic field $B_{0,off}$ by the at least one further magnet, which further magnetic field $B_{0,off}$ is overlaid with the magnetic field of the main magnet, e.g., the main magnet field, $B_{0,m}$, or in other words $B_0 = B_{0,m} + B_{0,off}$. The at least one further magnet may include at least one gradient coil. The further magnetic field $B_{0,off}$ may therefore also be called a gradient offset. The further magnetic field $B_{0,off}$ may be varied by the at least one gradient coil, for example, by a change in a current flow through the at least one gradient coil.

A radio frequency transmitting voltage $U_{tra}(f)$ may be adjusted in the case of different applied magnetic fields such that an amplitude of a magnetic resonance signal remains constant. The RF transmitting voltage $U_{tra}(f)$ may be a voltage applied to the RF transmitting antenna. The magnetic resonance signal may be detected by a receiving antenna, which may also be identical to the RF transmitting antenna and may be evaluated by an evaluation unit. The transfer function may then be determined according to $H(f) \propto 1/U_{tra}(f)$ from the RF transmitting voltages $U_{tra}(f=f_L)$ adjusted for the different applied magnetic fields $B_0$.

The magnetic resonance signal, whose amplitude is evaluated for determining the transfer function, may originate from just one plane. This plane is advantageously located in the isocenter of the magnetic resonance device, because the center point of the field of view is also conventionally located here. In particular, the plane is oriented perpendicularly to a longitudinal axis of the magnetic resonance device. The longitudinal axis may be called the z-axis. In this case, the position of the isocenter is defined at z=0, so this condition also applies here for said plane. The longitudinal axis may be a center line of a cylinder that describes the shape of a patient-receiving region of the magnetic resonance device.

It is also conceivable for the magnetic resonance signals to originate from different planes. For this purpose, for example, a spatially varying gradient magnetic field, (also called just a gradient field for short), $B_{0,gra}$ is applied, for example, by the at least one gradient coil. A spatially varying, in particular, linearly increasing or decreasing, applied magnetic field $B_0(z) = B_{0,m}(z) + B_{0,gra}(z)$ is formed thereby, for example, parallel to a z-axis. Consequently, different Larmor frequencies $f_L(z) = \gamma B_0(z)$ also act parallel to the axis z. However, in contrast to the method variant described above, in which the magnetic resonance signals originate from just one plane, it cannot be ruled out here that the spatial field distribution of the applied magnetic field $B_0(z)$ falsifies the result.

Furthermore, it is proposed that the transfer function is determined using a particularly numeric simulation, for example, with the aid of a computer.

It is therefore conceivable for the transfer function to be determined using an absorbed power and/or using an input reflection factor and/or using a current in a RF transmitting antenna and/or using at least one pickup probe and/or using a forward and/or reflected voltage in a power supply unit to the RF transmitting antenna and/or by way of a variation in an applied magnetic field and/or using a simulation.

It is proposed that the transfer function is determined just once, for instance during the course of a tune-up of the magnetic resonance device. This is primarily advantageous if the anticipated effect on the frequency response due to the respective patient is rather low.

It is also conceivable for the transfer function to be determined several times, in particular, before each magnetic resonance examination of a patient. Particularly high accuracy requirements may be met thereby.

Furthermore, a method for the correction of a transmission signal of a magnetic resonance device is proposed. A transfer function is provided here which has been determined according to one of the methods described above. The transmission signal is corrected using the transfer function, moreover.

An excitation pulse may be emitted by the transmitting system using the corrected transmission signal. The transmission signal is advantageously corrected in such a way that a uniform flip angle excitation occurs due to the emitted excitation pulse.

Correction of the transmission signal may be made, for example, by way of a correction unit which may have one or more processors. The transfer function may be provided from a storage unit, in which the transfer function is stored.

One embodiment of the method provides that the transfer function is standardized, and the excitation pulse is corrected using the standardized transfer function.

For example, the inverse of the transfer function $G(f)=(H(f))^{-1}$ is formed and this is scaled so the maximum thereof is equal to 1, in other words $MAX(G(f))=1$. This function may then be used for a correction, (e.g., predistortion), of the transmission signal $U_{tra}(f)$: $U(f)=G(f)*U_{tra}(f)$. Here, $U(f)$ is the corrected transmission signal and $U_{tra}(f)$ the actually desired transmission signal in the frequency range.

A further embodiment of the method provides that the transfer function is transformed, and the excitation pulse is corrected using the transformed transfer function.

For example, the transfer function is transformed in a time domain. For example, the inverse Fourier transform $g(t)$ is formed from $G(f)$ for use in the time domain t. The transmission signal may be corrected by a convolution $U(t)=g(t)**U_{tra}(t)$. As a rule, the time characteristic of the desired transmission signal $U_{tra}(t)$ is known, for which reason the convolution may be implemented with the inverse transfer function.

One embodiment of the method provides that an applied magnetic field is less than 1 Tesla (T). The applied magnetic field may be a magnetic field around which the nuclear spins deflected by the excitation pulses precess during the magnetic resonance scan. The magnetic field may be composed of a main magnet field and a gradient magnetic field that are overlaid. In particular, the magnetic resonance device has a main magnet field of less than 1 T.

This aspect is based on the knowledge that the bandwidth of the transmitting system is low with a low applied magnetic field. Transmission signals, whose transmit frequency does not match the center frequency of the transmitting system, are particularly strongly falsified by the small bandwidth. The proposed correction of the transmission signal using the transfer function is therefore particularly advantageous in this case.

The transmitting system may have at least one superconducting, (e.g., cooled), RF transmitting antenna. As a rule, RF transmitting antennae of this kind have rather low bandwidths, for which reason the correction of the transmission signal using the transfer function is particularly advantageous here as well, in particular, also in the case of applied magnetic fields of more than 1 T.

In one embodiment, a plurality of slices, (e.g., spaced apart slices), is simultaneously excited by the transmitting system. The slices may be spaced apart parallel to a magnetic field gradient, for example, parallel to a longitudinal axis of the magnetic resonance device.

With simultaneous excitation of a plurality of slices, RF pulses having a different transmit frequency or a RF pulse having a frequency spectrum, which includes portions spaced apart from the center frequency, are generated. The different transmission frequencies may be necessary to produce resonance conditions for an effective excitation of the nuclear spins in the desired slices, in which a different applied magnetic field is given.

The correction of the transmission signal using the transfer function means that the nuclear spins having the same flip angle are excited in the plurality of slices. Simultaneous excitation of a plurality of slices may also be used in Simultaneous MultiSlice (SMS) techniques.

A further embodiment of the method provides that the transmitting system excites a field of view (FoV), which field of view has an extent in a first direction. A gradient magnetic field is applied in the first direction, for example, parallel to the longitudinal axis of the magnetic resonance device. The product of the extent of the field of view of the first direction and an amplitude of the gradient magnetic field in the first direction is greater than 1 mT, greater than 2 mT, or greater than 5 mT.

With large fields of view, large slice shifts are possible which, with high amplitudes of the gradient magnetic field, lead to large frequency shifts, and therewith to large spacings from the center frequency of the transmitting system. This may be considered by the proposed correction of the transmission signal using the transfer function.

Furthermore, a magnetic resonance device is proposed which is designed to carry out a method for determining a transfer function of a transmitting system of a magnetic resonance device and/or for the correction of a transmission signal of a magnetic resonance device.

The advantages of the magnetic resonance device match the advantages of the method for determining a transfer function of a transmitting system of a magnetic resonance device and/or of the method for the correction of a transmission signal of a magnetic resonance device, which have been stated above in detail. Features, advantages, or alternative embodiments mentioned in this connection may similarly also be transferred to the magnetic resonance device and vice versa.

In other words, the concrete claims are also developed by the features which are described or claimed in connection with a method. The corresponding functional features of the method are formed by corresponding concrete modules, in particular, by hardware modules.

For the correction of the transmission signal, the magnetic resonance device may include a correction unit which has, for example, one or more processors. The magnetic resonance device may include a storage unit in which the transfer function may be stored and/or may be transmitted from there to the correction unit.

The magnetic resonance device may have units for determining the transfer function, such as one or more pickup probes.

Furthermore, a computer program product is proposed that includes a program and may be directly loaded into a storage device of a programmable arithmetic unit of a correction unit and has program modules, for example, libraries and auxiliary functions, in order to carry out a method for determining a transfer function of a transmitting system of a magnetic resonance device and/or a method for the correction of a transmission signal of a magnetic resonance device when the computer program product is run in the correction unit. The computer program product may include software having a source code, which still has to be compiled and linked or which just has to be interpreted, or an executable software code which just has to be loaded into the correction unit for execution. The method for determining a transfer function of a transmitting system of a magnetic resonance device and/or a method for the correction of a transmission signal of a magnetic resonance device may be carried out quickly, robustly, and in a way that may be repeated in an identical manner by the computer program product. The computer program product is configured in such a way that it may carry out the method acts by the correction unit. The correction unit has the requirements in each case, (e.g., an appropriate working memory and/or an appropriate logic unit), so the respective method acts may be carried out efficiently.

BRIEF DESCRIPTION OF THE DRAWINGS

Further advantages, features, and details of the disclosure emerge from the exemplary embodiments described below and with reference to the drawings. Mutually corresponding parts are provided with the same reference characters in all figures, in which.

DETAILED DESCRIPTION

Figure 1:
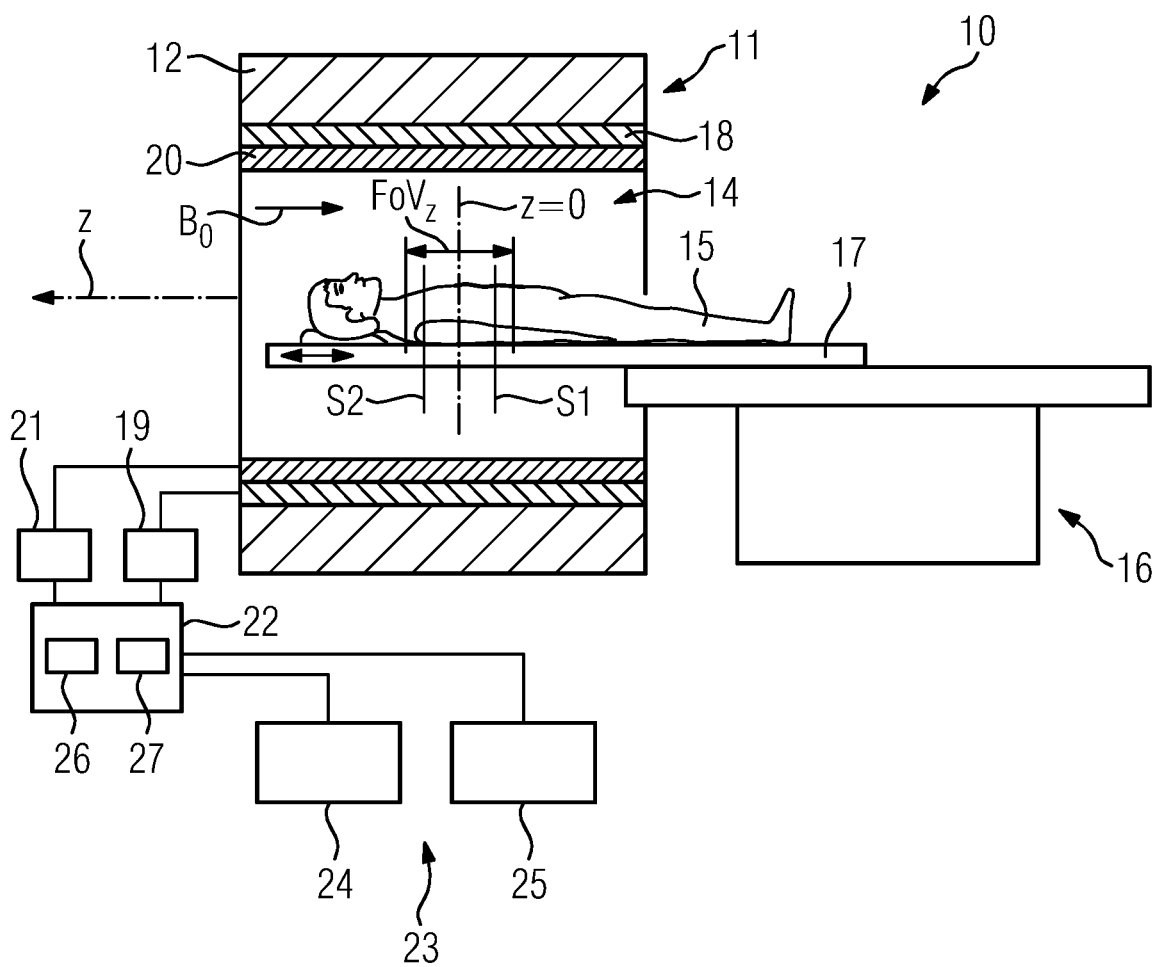
FIG. 1 depicts a magnetic resonance device in a schematic diagram.

FIG. 1 schematically depicts a magnetic resonance device 10. The magnetic resonance device 10 includes a magnetic unit 11, which may include a superconducting, main magnet 12 for generating a strong main magnet field, which is, in particular, constant over time. The magnetic resonance device 10 includes a patient-receiving region 14 for receiving a patient 15. In the present exemplary embodiment, the patient-receiving region 14 is cylindrical and cylindrically surrounded in a circumferential direction by the magnetic unit 11. A different design of the patient-receiving region 14 is also conceivable.

The patient 15 may be pushed by a patient-positioning device 16 of the magnetic resonance device 10 into the patient-receiving region 14. The patient-positioning device 16 has for this purpose an examination table 17 designed so it may be moved inside the patient-receiving region 14.

The magnetic unit 11 has at least one, (e.g., three), gradient coils 18 for generating a gradient magnetic field, which is used for spatial encoding during imaging. The gradient magnetic field and the main magnet field are overlaid to form an applied magnetic field $B_0$. The at least one gradient coil 18 is controlled by a gradient control unit 19 of the magnetic resonance device 10.

The magnetic unit 11 includes a RF transmitting antenna 2, which in the present exemplary embodiment is designed as a body coil permanently integrated in the magnetic resonance device 10. The RF transmitting antenna 20 is designed for excitation of nuclear spins which are established in the applied magnetic field $B_0$.

The RF transmitting antenna 20 is controlled by a RF antenna control unit 21 of the magnetic resonance device 10 in that transmission signals are transmitted by the RF antenna control unit 21 to the RF transmitting antenna 20. By the transmission signals, RF pulses are generated by the RF transmitting antenna 20, and the RF pulses are irradiated into an examination space formed by a patient-receiving region 14 of the magnetic resonance device 10. The irradiated RF pulses cause a magnetic alternating field, which may also be called a $B_1$ field, in the patient-receiving region 14.

The RF transmitting antenna 20 and/or the RF antenna control unit 21 are therefore parts of a transmitting system of the magnetic resonance device 10, which have a transmission characteristic dependent on the frequency of the RF pulses. The RF transmitting antenna 20 may also be designed for receiving magnetic resonance signals.

The magnetic resonance device 10 has a system control unit 22 for controlling the main magnet 12, the gradient control unit 19, and the RF antenna control unit 21. The system control unit 22 centrally controls the magnetic resonance device 10, such as carrying out a predetermined imaging pulse sequence. The system control unit 22 includes a correction unit 26 and a storage unit 27. With the aid of the correction unit 26, a frequency-dependent transfer function may be determined using a transmission characteristic of a transmitting system which may optionally be stored in the storage unit 27, and/or a transmission signal may be corrected using the transfer function. A corresponding computer program product may be run in the correction unit for this purpose.

In addition, the system control unit 22 includes an evaluation unit (not shown) for an evaluation of medical image data which is acquired during the magnetic resonance examination. Furthermore, the magnetic resonance device 10 includes a user interface 23, which is connected to the system control unit 22. Control information, (e.g., imaging parameters), and reconstructed magnetic resonance images may be displayed on a display unit 24, (e.g., on at least one monitor), of the user interface 23 for medical staff. The user interface 23 also has an input unit 25 by which the medical staff may input information and/or parameters during a scanning process.

Figure 2:
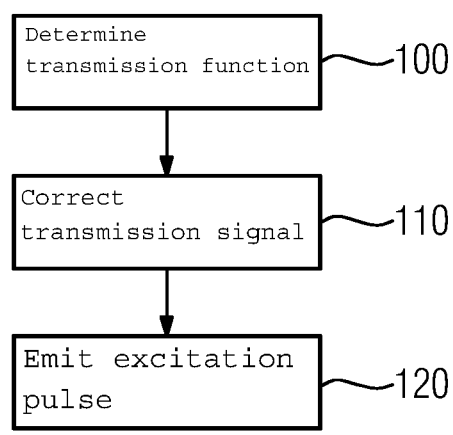
FIG. 2 depicts a block diagram of a method for determining a transfer function of a transmitting system of a magnetic resonance device and/or a method for the correction of a transmission signal of a magnetic resonance device.

FIG. 2 depicts a block diagram of a method for determining a transfer function of a transmitting system of a magnetic resonance device and/or a method for the correction of a transmission signal of a magnetic resonance device. In act 100, a frequency-dependent transfer function is determined using a transmission characteristic of the transmitting system of the magnetic resonance device 10.

In optional act 110, the determined transfer function is provided and used for a correction of a transmission signal. In a further optional act 120, an excitation pulse is emitted by the transmitting system using the corrected transmission signal.

The transfer function H(f) reflects a transmission of a RF transmitting voltage $U_{tra}(f)$ into a generated $B_1$ field $B_1(f)$: $H(f) \propto B_1(f)/U_{tra}(f)$.

A plurality of procedures is conceivable for determining this transfer function in act 100, in particular for frequencies close to the center frequency of the transmitting system. For example, the transfer function may theoretically be determined using a simulation.

The transfer function H(f) may also be determined empirically. For example, the frequency dependency of the generated $B_1$ field is determined by the root of an absorbed power which may be given with the aid of an input reflection factor R(f) of the RF transmitting antenna 20 according to $H(f) \propto (1-|R(f)|^2)^{1/2}$.

The transfer function H(f) may also be determined with the aid of an electrical current in the RF transmitting antenna 20. The fact that in the frequency range of interest, the generated $B_1$ field is proportional to the current in the RF transmitting antenna 20 is used here. H(f) may also be determined by way of measurement of the current.

Two variants of a current measurement are illustrated with reference to FIG. 3. The current may be measured on the one hand by way of a pickup probe 30, which is placed in the vicinity of the RF transmitting antenna 20, formed here as a birdcage coil. The pickup probe 30 is arranged here in the vicinity of an end ring 35 of the birdcage coil 20. The voltage $U_{pu}$ induced in the pickup probe 30 is proportional to the current in the end ring 35 and therewith also proportional to the generated $B_1$ field:

$H(f) \propto U_{pu}(f)/U_{tra}(f)$.

Alternatively, or additionally, for measurement by pickup probes 30, a value $U_{pu,coupling}(f)$, which is also again proportional to the current in the RF transmitting antenna 20 and therefore the generated $B_1$ field: $U_{pu,coupling}(f) \propto B_1(f)$, may also be obtained from a measurement of a complex addition of a forward voltage $U_{F,1}$, $U_{F,2}$ and reflected voltage $U_{R,1}$, $U_{R,2}$ in electrical lines $L_1$ and $L_2$, which connect the RF transmitting antenna 20 to a RF power amplifier 32.

Figure 3:
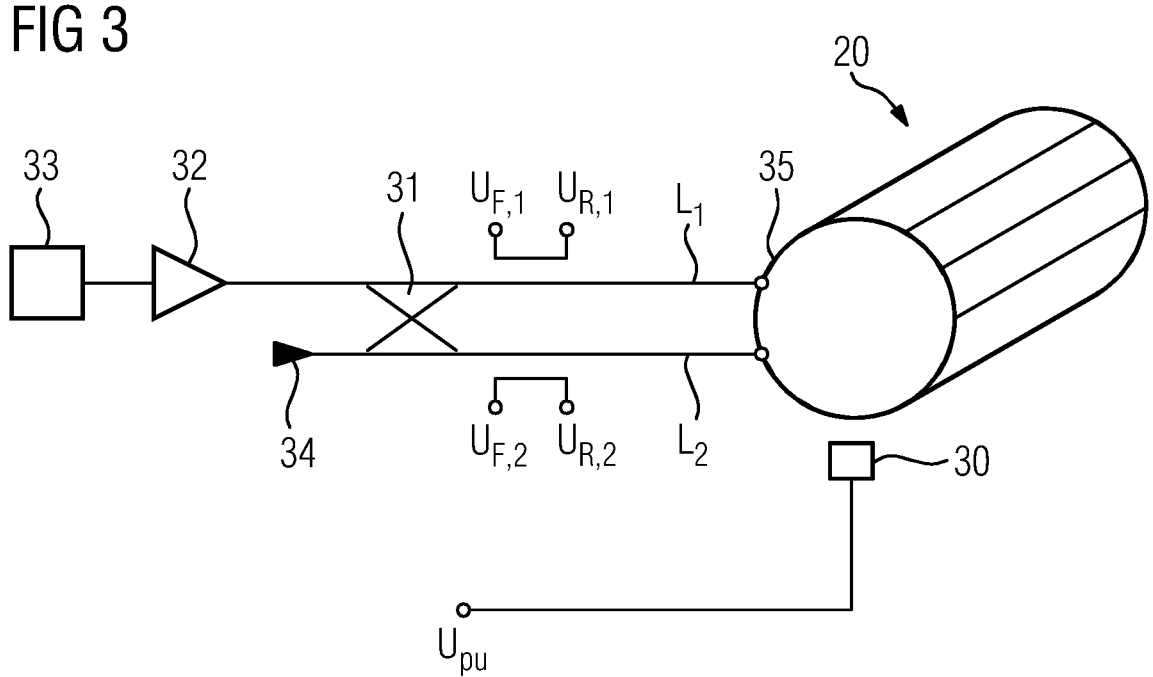
FIG. 3 depicts an exemplary construction of a RF transmission chain.

FIG. 3 depicts further possible components of a RF transmission chain, such as, for instance, a 90° hybrid coupler 31, a terminating resistor 34, and further elements 33 of the RF transmission chain.

A further method is based on a measurement of the $B_1$ field using a recording of magnetic resonance signals. An operating frequency of the magnetic resonance device 10 is changed in the process in order to determine the frequency dependency of the transfer function. The operating frequency of the magnetic resonance device 10 may be changed by a variation in the applied magnetic field $B_0$. The applied magnetic field $B_0$ may be changed by a change in the main magnet field and/or the gradient magnetic field. To determine the transfer function H(f), the RF transmitting voltages $U_{tra}(f)$ are determined for different strengths of the applied magnetic field $B_0$, at which voltages the amplitudes of the magnetic resonance signals remain constant. The following is obtained thereby: $H(f) \propto 1/U_{tra}(f)$. Magnetic resonance signals may be evaluated from just one plane, such as, in particular, the plane z=0 shown in FIG. 1. The z-axis is a longitudinal axis of the magnetic resonance device, which is located centrally here in the cylindrical patient-receiving region 14 of the magnetic resonance device 10.

Furthermore, it is conceivable to carry out the measurement of the $B_1$ field in different planes, with the different planes corresponding to different frequencies. The spatial field distribution is also included in the result here, however.

The transfer function H(f) may be used either in the frequency range or particularly advantageously in the time domain. In both cases, the inverse of the transfer function $G(f) = (H(f))^{-1}$ may be formed first and scaled such that MAX(G(f))=1. This function is then used for correction of the transmission signals, whereby a smooth frequency response is achieved: $U(f) = G(f) * U_{tra}(f)$. U(f) is the corrected transmission signal and $U_{tra}(f)$ the actually desired transmission signal in the frequency range.

For use in the time domain, the inverse Fourier transform g(t) of G(f) may be formed first. The transmission signal may then be corrected by a convolution $U(t) = g(t) * U_{tra}(t)$. As a rule, the time characteristic of the desired transmission signal $U_{tra}(t)$ is known, for which reason the convolution may be implemented with the inverse transfer function.

If particularly high accuracy requirements are placed on the correction, the transfer function is advantageously determined for each patient. With less high accuracy requirements and/or where the patient has less of an effect on the frequency response, detection of the transfer function with an apparatus of the magnetic resonance device may be sufficient.

Figure 4:
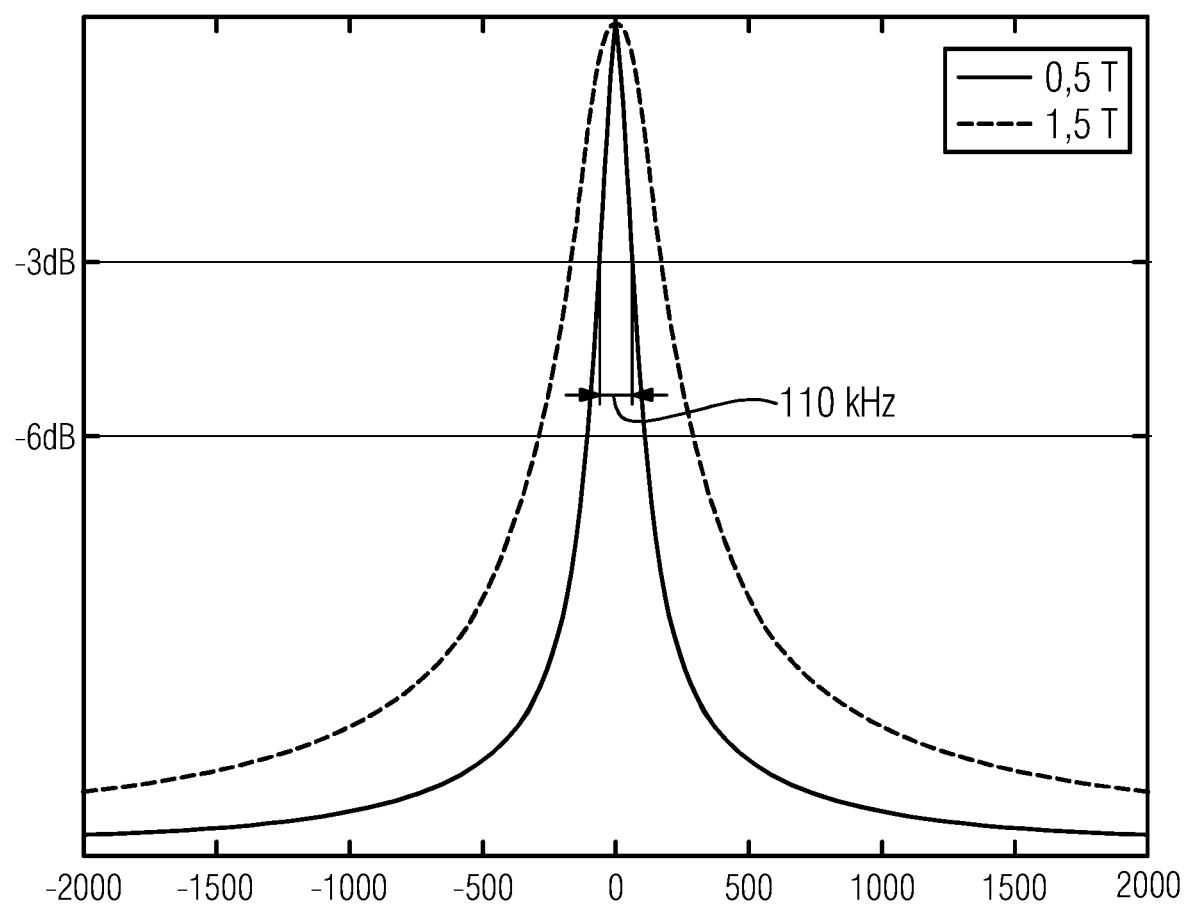
FIG. 4 depicts a graph with exemplary frequency-dependent impedance curves of a RF transmitting antenna in the case of different applied magnetic fields.

The correction in act 110 may be used in the case of applied magnetic fields $B_0$ of less than 1 T. The method may be employed under this condition because the bandwidth of the RF transmitting antenna 20 becomes narrower while retaining the same quality. This connection will be illustrated in more detail with reference to FIG. 4. This shows by way of example an input impedance of a RF transmitting antenna 20 having a quality of 200. A deviation from the center frequency in kHz is plotted on the horizontal axis, while the input impedance standardized to 1 is plotted on the vertical axis. The graph includes two curves that show the characteristics of an applied magnetic field of 0.5 T and 1.5 T. The curve for 0.5 T is significantly more narrowband. The −3 dB bandwidth is only 110 kHz, in other words with a frequency offset of 55 kHz the generated $B_1$ field is already reduced by 3 dB compared to the maximum.

With low field strengths, the fact that the patient 15 causes only slight loading of the RF transmitting antenna 20 also comes into effect, whereby the bandwidth of the RF transmitting antenna remains the same. This is different in the case of high field systems in which the bandwidth is significantly increased by the patient load.

Even in systems with superconducting RF transmitting antennae, the correction of the transmission signal is beneficial because superconducting RF transmitting antennae may be quite narrow-band.

In addition, the correction of the transmission signal may be used particularly advantageously with simultaneous excitation of a plurality of slices. For example, FIG. 1 shows two slices S1 and S2. These slices are located in different planes here perpendicular to the longitudinal axis z of the magnetic resonance device 10, so when a gradient magnetic field is applied parallel to this longitudinal axis z, different applied magnetic fields act in these planes. To excite the nuclear spins in these slices, it is therefore necessary for the RF pulses generated using the transmission signal to include different frequencies and/or for the frequency spectrum of a RF pulse to have portions with a different frequency. Without correction the excitation in the different slices S1 and S2 would lead to a different flip angle excitation of the nuclear spins.

The correction of the transmission signal has an advantageous effect even with a large field of view. FIG. 1 also illustrates an extent of a field of view $FoV_z$ parallel to the longitudinal axis z of the magnetic resonance device 10. If a gradient magnetic field is applied in this direction, the otherwise adverse effects of a frequency offset caused thereby may be compensated in this direction by a correction of the transmission signal. For example, a frequency offset of 170 kHz results with a slice shift of 200 mm at an amplitude of the gradient magnetic field of 20 mT/m.

To conclude, reference is made to the fact that the methods described in detail above and the illustrated magnetic resonance device are merely exemplary embodiments which may be modified in a wide variety of ways by a person skilled in the art without departing from the scope of the disclosure. Furthermore, use of the indefinite article "a" or "an" does not preclude the relevant features from also being present multiple times. Similarly, the term "unit" does not preclude the relevant components from including a plurality of cooperating sub-components which may optionally also be spatially distributed.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a transfer function of a transmitting system of a magnetic resonance device, the method comprising:
   determining the transfer function using a transmission characteristic of the transmitting system of the magnetic resonance device,
   wherein the transfer function is frequency-dependent, and
   wherein the transfer function is configured to correct a transmission signal having a transmit frequency that does not match a center frequency of the transmitting system.

2. The method of claim 1, wherein the transfer function is determined using an absorbed power.

3. The method of claim 1, wherein the transfer function is determined using an input reflection factor R(f),
   wherein the transfer function is proportional to a function: $(1-|R(f)|^2)^{1/2}$.

4. The method of claim 1, wherein the transfer function is determined using a current I(f) measured in a radio frequency (RF) transmitting antenna of the magnetic resonance device,
   wherein the transfer function is proportional to a function: $I(f)/U_{tra}(f)$,
   where $U_{tra}(f)$ is a RF transmitting voltage.

5. The method of claim 1, wherein the transfer function is determined using at least one pickup probe,
   wherein the transfer function is proportional to a function: $U_{pu}(f)/U_{tra}(f)$,
   where $U_{pu}(f)$ is a voltage induced in the at least one pickup probe and $U_{tra}(f)$ is a RF transmitting voltage.

6. The method of claim 1, wherein the transfer function is determined using a forward voltage and a reflected voltage in a power supply unit to a RF transmitting antenna,
   wherein the transfer function is proportional to a function: $U_{pu,coupling}(f)/U_{tra}(f)$,
   where $U_{pu,coupling}(f)$ is obtained from a measurement of a complex addition of the forward voltage and the reflected voltage, and $U_{tra}(f)$ is a RF transmitting voltage.

7. The method of claim 1, wherein the transfer function is determined by a variation in an applied magnetic field,
   wherein the transfer function is proportional to a function: $1/U_{tra}(f)$,
   where $U_{tra}(f)$ is a RF transmitting voltage adjusted for the applied magnetic field.

8. The method of claim 7, wherein the RF transmitting voltage is adjusted in a case of different magnetic field strengths such that an amplitude of a magnetic resonance signal remains constant.

9. The method of claim 8, wherein the magnetic resonance signal originates from just one plane.

10. The method of claim 1, wherein the transfer function is determined using a simulation.

11. A method for correction of a transmission signal of a magnetic resonance device, the method comprising:
    providing a transfer function that has been determined using a transmission characteristic of a transmitting system of the magnetic resonance device, wherein the transfer function is frequency-dependent; and
    correcting the transmission signal using the transfer function, the transmission signal has a transmit frequency that does not match a center frequency of the transmitting system.

12. The method of claim 11, further comprising:
    emitting an excitation pulse by the transmitting system using the corrected transmission signal such that a uniform flip angle excitation occurs due to the emitted excitation pulse.

13. The method of claim 12, wherein the transfer function is standardized, and the excitation pulse is corrected using the standardized transfer function.

14. The method of claim 12, wherein the transfer function is transformed, and the excitation pulse is corrected using the transformed transfer function.

15. The method of claim 11, wherein an applied magnetic field is less than 1 T.

16. The method of claim 11, wherein the transmitting system comprises at least one superconducting RF transmitting antenna.

17. The method of claim 11, further comprising:
    exciting a plurality of slices simultaneously with the transmitting system.

18. The method of claim 11, wherein the transmitting system excites a field of view,
    wherein the field of view has an extent in a first direction,
    wherein a gradient magnetic field is applied in the first direction, and
    wherein a product of the extent of the field of view of the first direction and an amplitude of the magnetic gradient field in the first direction is greater than 2 mT.

19. A magnetic resonance device comprises:
    a correction unit having one or more processors configured to determine a transfer function using a transmission characteristic of a transmitting system of the magnetic resonance device, wherein the transfer function is frequency-dependent; and
    a storage unit configured to store the transfer function,
    wherein the transfer function is configured to correct a transmission signal having a transmit frequency that does not match a center frequency of the transmitting system.

20. A computer program product having a program configured to be loaded directly into a storage device of a programmable arithmetic unit of a correction unit of a magnetic resonance device, the computer program product configured to, when the program is run in the programmable arithmetic unit of the correction unit, at cause the magnetic resonance device to at least perform:
    determine a transfer function using a transmission characteristic of a transmitting system of the magnetic resonance device,
    wherein the transfer function is frequency-dependent,
    wherein the transfer function is configured to correct a transmission signal having a transmit frequency that does not match a center frequency of the transmitting system.

* * * * *